(12) United States Patent
Kim et al.

(10) Patent No.: US 8,680,527 B2
(45) Date of Patent: Mar. 25, 2014

(54) PHOTOMASK AND THIN-FILM TRANSISTOR FABRICATED USING THE PHOTOMASK

(75) Inventors: Yeon-Ju Kim, Seoul (KR); Sung-Jae Moon, Seoul (KR); Yun-Jung Cho, Asan-si (KR); Bum-Ki Baek, Suwon-si (KR); Kwang-Hoon Lee, Anyang-si (KR); Byoung-Sun Na, Hwaseong-si (KR); Sung-Hoon Yang, Asan-si (KR); Yoon-Jang Kim, Suwon-si (KR); Eun Cho, Cheonan-si (KR)

(73) Assignee: Samsung Display Co., Ltd. (KR)

( * ) Notice: Subject to any disclaimer, the term of this patent is extended or adjusted under 35 U.S.C. 154(b) by 283 days.

(21) Appl. No.: 12/978,446

(22) Filed: Dec. 24, 2010

(65) Prior Publication Data

US 2011/0156046 A1 Jun. 30, 2011

(30) Foreign Application Priority Data

Dec. 24, 2009 (KR) .................. 10-2009-0131175

(51) Int. Cl.
*H01L 29/417* (2006.01)

(52) U.S. Cl.
USPC ...................... 257/59; 257/E29.12

(58) Field of Classification Search
None
See application file for complete search history.

(56) References Cited

U.S. PATENT DOCUMENTS 6,897,482 B2 * 5/2005 Morita et al. ............. 257/72
7,445,970 B2 * 11/2008 Lai ............................ 438/149

FOREIGN PATENT DOCUMENTS

KR 2008002186 A * 1/2008

* cited by examiner

*Primary Examiner* — Wensing Kuo
(74) *Attorney, Agent, or Firm* — Cantor Colburn LLP (57) ABSTRACT

A photomask includes; a source electrode pattern including; a first electrode portion which extends in a first direction, a second electrode portion which extends in the first direction and is substantially parallel to the first electrode portion, and a third electrode portion which extends from a first end of the first electrode portion to a first end of the second electrode portion and is rounded with a first curvature, a drain electrode pattern which extends in the first direction and is disposed between the first electrode portion and the second electrode portion, wherein an end of the drain electrode pattern is rounded to correspond to the third electrode portion; and a channel region pattern which is disposed between the source electrode pattern and the drain electrode pattern, wherein a center location of the first curvature and a center location of the rounded portion of the end of the drain electrode pattern are the same.

9 Claims, 7 Drawing Sheets

PHOTOMASK AND THIN-FILM TRANSISTOR FABRICATED USING THE PHOTOMASK

This application claims priority to Korean Patent Application No. 10-2009-0131175, filed on Dec. 24, 2009, and all the benefits accruing therefrom under 35 U.S.C. §119, the content of which in its entirety is herein incorporated herein by reference.

BACKGROUND OF THE INVENTION

1. Field of the Invention

The present invention relates to a photomask and a thin film transistor fabricated using the photomask.

2. Description of the Related Art

Liquid crystal displays ("LCDs") are one of the most widely used types of flat panel displays. Generally, an LCD includes a pair of substrates having electrodes disposed thereon and a liquid crystal layer interposed between the substrates. In the typical LCD, thin-film transistors ("TFTs") disposed on the substrates are driven to apply voltages to the electrodes. Accordingly, orientations of liquid crystal molecules of the liquid crystal layer are rearranged, and thus the amount of light that passes through the liquid crystal layer may be adjusted according to the orientations of the liquid crystal molecules.

A source electrode, a drain electrode and a channel region of a TFT may be formed by stacking a conductive layer and photoresist on a substrate, forming a source electrode pattern, a drain electrode pattern and a channel region pattern on the photoresist using a photomask and then etching the conductive layer using the photoresist pattern.

As LCDs become slimmer, a linewidth of a channel region of a TFT is increasingly reduced. Thus, the occurrence of even a small processing deviation during fabrication of a TFT may result in an increased number of channel open defects or channel short defects.

These defects have a serious negative effect on the operation of a TFT, thereby adversely affecting the overall reliability of a display device utilizing the same, whether the display device is an LCD, an organic light emitting diode ("OLED") display, plasma display or other type of display device.

BRIEF SUMMARY OF THE INVENTION

Aspects of the present invention provide a photomask used to fabricate a thin-film transistor ("TFT") having reduced channel-related defects and thus enhanced reliability.

Aspects of the present invention also provide a TFT with enhanced reliability which is fabricated using the photomask.

However, aspects of the present invention are not restricted to the one set forth herein. The above and other aspects of the present invention will become more apparent to one of ordinary skill in the art to which the present invention pertains by referencing the detailed description of the present invention given below.

According to an exemplary embodiment of the present invention, t a photomask includes; a source electrode pattern including; a first electrode portion which extends in a first direction, a second electrode portion which extends in the first direction and is substantially parallel to the first electrode portion, and a third electrode portion which extends from a first end of the first electrode portion to a first end of the second electrode portion and is rounded with a first curvature, a drain electrode pattern which extends in the first direction and is disposed between the first electrode portion and the second electrode portion, wherein an end of the drain electrode pattern is rounded to correspond to the third electrode portion, and a channel region pattern which is disposed between the source electrode pattern and the drain electrode pattern, wherein a center location of the first curvature and a center location of the rounded portion of the end of the drain electrode pattern are the same.

According to another exemplary embodiment of the present invention, a photomask includes; a source electrode pattern which includes a plurality of source electrode segments, and a drain electrode pattern which includes a plurality of drain electrode segments, wherein vertices of at least three of the source electrode segments contact a first virtual circle.

According to another exemplary embodiment of the present invention, there is provided a TFT including a source electrode, a drain electrode and a channel region which are fabricated using the above described photomask.

BRIEF DESCRIPTION OF THE DRAWINGS

The above and other aspects and features of the present invention will become more apparent by describing in detail exemplary embodiments thereof with reference to the attached drawings, in which:

FIGS. 2 through 3B are diagrams illustrating a light transmission effect of the first exemplary embodiment of a photomask according to the present invention;

DETAILED DESCRIPTION OF THE INVENTION

The invention now will be described more fully hereinafter with reference to the accompanying drawings, in which embodiments of the invention are shown. This invention may, however, be embodied in many different forms and should not be construed as limited to the embodiments set forth herein. Rather, these embodiments are provided so that this disclosure will be thorough and complete, and will fully convey the scope of the invention to those skilled in the art. Like reference numerals refer to like elements throughout.

In the present specification, a photomask may denote a mask used to form a predetermined pattern on a photoresist. Specifically, the photomask may denote a mask used to form a predetermined pattern on a photoresist which is stacked on a substrate.

Hereinafter, first exemplary embodiment of a photomask according to the present invention will be described with reference to FIGS. 1 through 3B.

Figure 1:
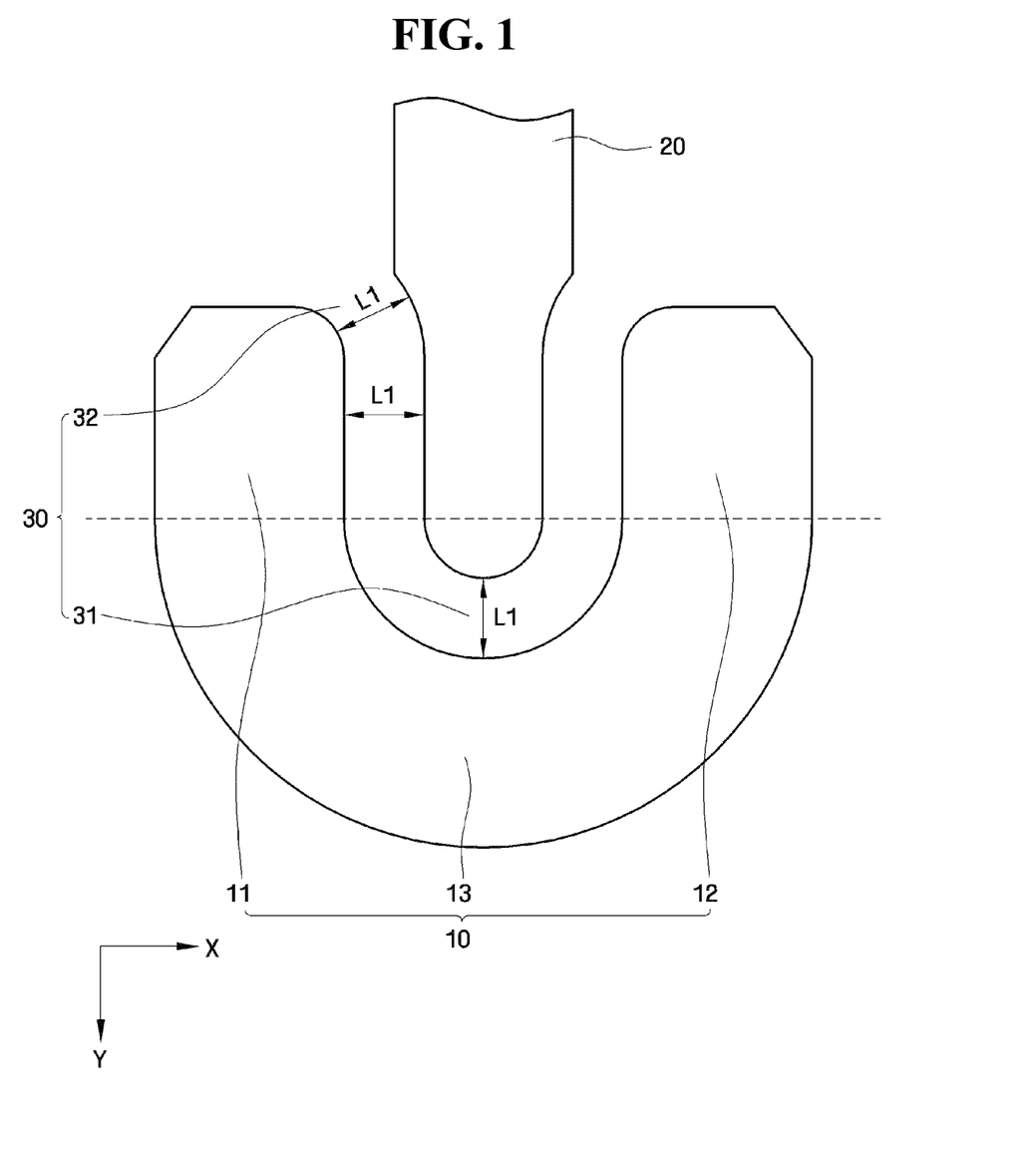
FIG. 1 is a diagram illustrating a structure of a first exemplary embodiment of a photomask according to the present invention.
Figure 2:
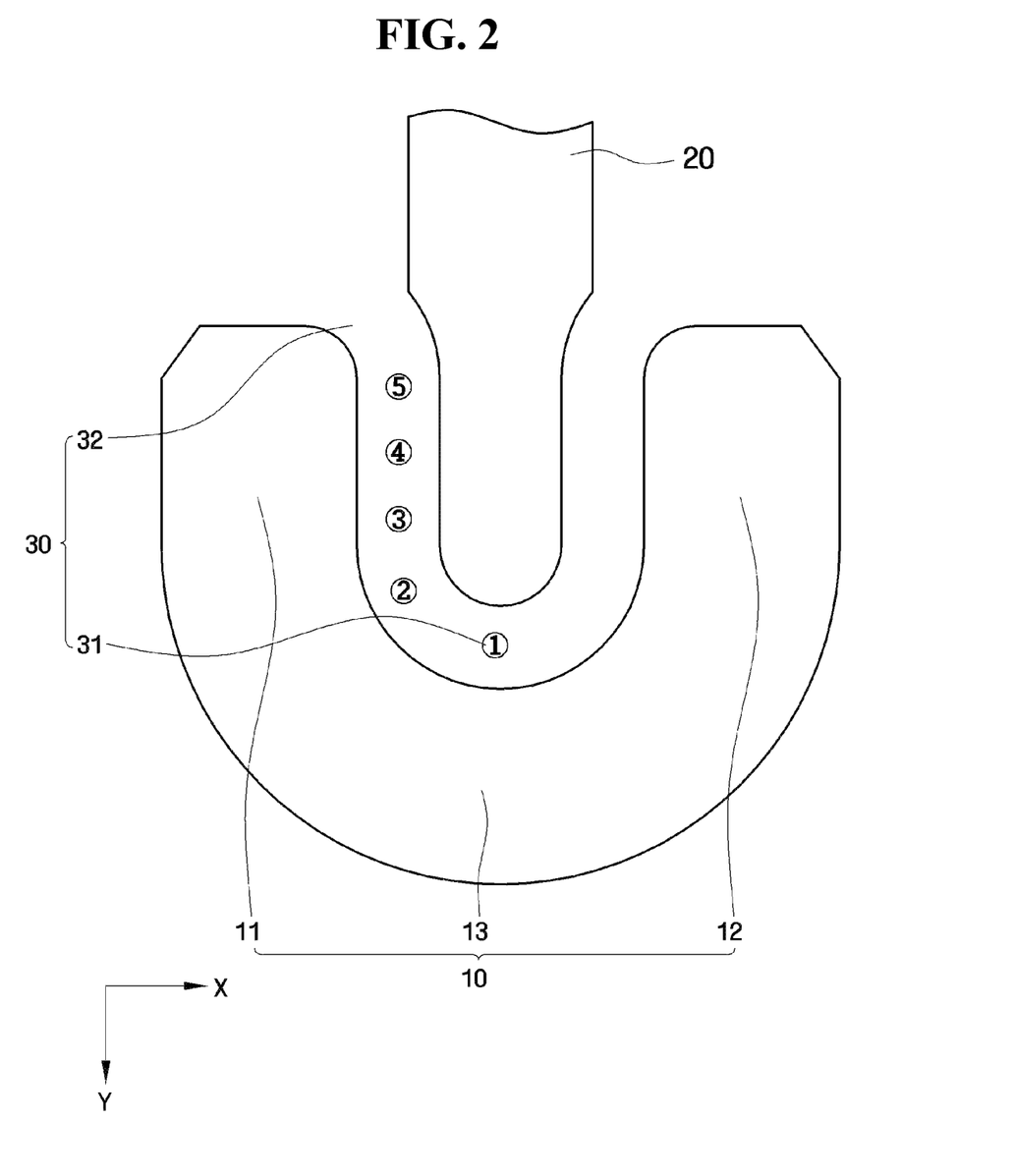
Figure 3A:
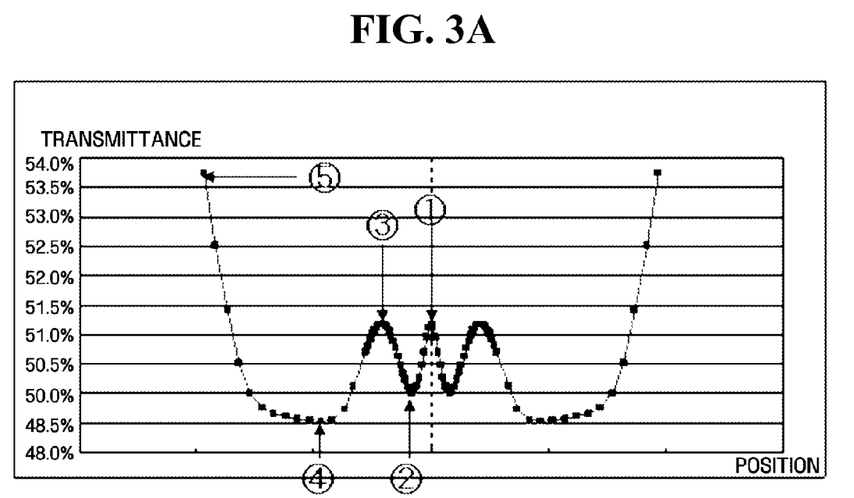
Figure 3B:
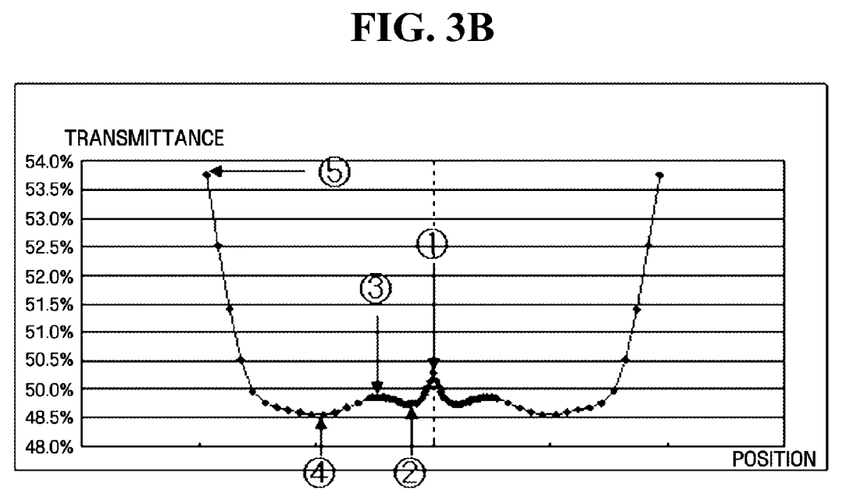

FIG. 1 is a diagram illustrating the structure of the first exemplary embodiment of a photomask according to the present invention. FIGS. 2 through 3B are diagrams for explaining the light transmission effect of the first exemplary embodiment of a photomask according to the present invention.

Referring to FIG. 1, the first exemplary embodiment of a photomask may include a source electrode pattern 10, a drain electrode pattern 20 and a channel region pattern 30.

The source electrode pattern 10 may include a first electrode portion 11, a second electrode portion 12 and a third electrode portion 13.

Specifically, the source electrode pattern 10 may include the first electrode portion 11 which extends primarily in a first direction (e.g., a Y direction), the second electrode portion 12 which also extends primarily in the first direction (e.g., the Y direction) to be substantially parallel to the first electrode portion 11, and the third electrode portion 13 which extends from a first end of the first electrode portion 11 to a first end of the second electrode portion 12 and is rounded having a first curvature. In other words, the source electrode pattern 10 includes first and second electrode portions 11 and 12 which form branches of the source electrode pattern and a curved third electrode portion 13 which connects the first and second electrode portions 11 and 12.

The drain electrode pattern 20 may be disposed between the first electrode portion 11 and the second electrode portion 12. Specifically, the drain electrode pattern 20 may extend in the first direction to be disposed between the first electrode portion 11 and the second electrode portion 12. Here, in one exemplary embodiment a first end of the drain electrode pattern 20 disposed between the first and second electrode portions 11 and 12 may be rounded with a second curvature to match the third electrode portion 13.

At least a part of a second end of the first electrode portion 11, which is disposed substantially opposite to the first end of the first electrode portion 11, and at least part of a first side of the drain electrode pattern 20 may be rounded with a third curvature. In addition, at least part of a second end of the second electrode portion 12, which is disposed substantially opposite to the first end of the second electrode portion 12, and at least part of a second side of the drain electrode pattern 20 may be rounded with a fourth curvature to match the rounded portion of the first side of the drain electrode pattern 20. In one exemplary embodiment, the second curvature may be equal to or different from the fourth curvature and the first curvature may be equal to or different from the third curvature.

The channel region pattern 30 may be disposed between the source electrode pattern 10 and the drain electrode pattern 20. Specifically, a channel region may be a region which is defined by boundaries of the source electrode pattern 10 and the drain electrode pattern 20 and is interposed between the source electrode pattern 10 and the drain electrode pattern 20, and the channel region pattern 30 may be a pattern for forming the channel region. A width L1 of the channel region pattern 30 as measured from the source electrode pattern 10 to a corresponding location on the drain electrode pattern 20 is constant throughout the channel region.

The channel region pattern 30 may include entrance portions 32 and a central portion 31.

Specifically, the entrance portions 32 may be portions of the channel region pattern 30 which are formed by the second ends of the first and second electrode portions 11 and 12 and the first and second sides of the drain electrode pattern 20, respectively. In addition, the central portion 31 may be a portion of the channel region pattern 30 which is formed by the third electrode portion 13 and the first end of the drain electrode pattern 20.

As described above, the third electrode portion 13 and the first end of the drain electrode pattern 20 included in the first exemplary embodiment of a photomask may be rounded to correspond to one another. Therefore, the width L1 of the channel region, that is, the distance between the source electrode pattern 10 and the drain electrode pattern 20 at the central portion 31 of the channel region pattern 30 may remain unchanged.

Furthermore, the second end of the first electrode portion 11 and the first side of the drain electrode pattern 20 included in the first exemplary embodiment of a photomask may be rounded to correspond to one another. Also, the second end of the second electrode portion 12 and the second side of the drain electrode pattern 20 may be rounded to correspond to one another. Therefore, the width L1 of the channel region, that is, the distance between the source electrode pattern 10 and the drain electrode pattern 20, at the entrance portions 32 of the channel region pattern 30 may remain unchanged.

In the first exemplary embodiment of a photomask, the width L1 of the channel region at the entrance portions 32 of the channel region pattern 30 may be equal to that of the channel region at the central portion 31 of the channel region pattern 30.

A thin-film transistor ("TFT") fabricated using a photoresist pattern which is formed using the first exemplary embodiment of a photomask may have fewer channel open or channel short defects than a TFT fabricated using a photomask in which a source electrode pattern and a drain electrode pattern are not rounded. Accordingly, the TFT fabricated using the first exemplary embodiment of a photomask may have a higher degree of reliability.

The above effects of the first exemplary embodiment of a photomask will now be described in greater detail with reference to FIGS. 2 through 3B. FIG. 3A is a graph illustrating light transmittances measured at first through fifth positions (1) through (5) in the channel region pattern 30 of the first exemplary embodiment of a photomask of FIG. 2 in which the source electrode pattern 10 and the drain electrode pattern 20 are rounded. FIG. 3B is a graph illustrating light transmittances measured at positions, which correspond respectively to the first through fifth positions (1) through (5), in a channel region pattern of a comparative photomask (not shown) in which a source electrode pattern and a drain electrode pattern are not rounded.

Referring to FIGS. 3A and 3B, the deviation in light transmittance was reduced from approximately 2% in FIG. 3B to approximately 0.7% in FIG. 3A. That is, a channel region with a more uniform width can be formed using the photomask according to the first exemplary embodiment than using the photomask (not shown) in which the source electrode pattern and the drain electrode pattern are not rounded. Accordingly, the channel open defect or channel short defect of a TFT fabricated using the first exemplary embodiment of a photomask can be reduced.

Figure 4:
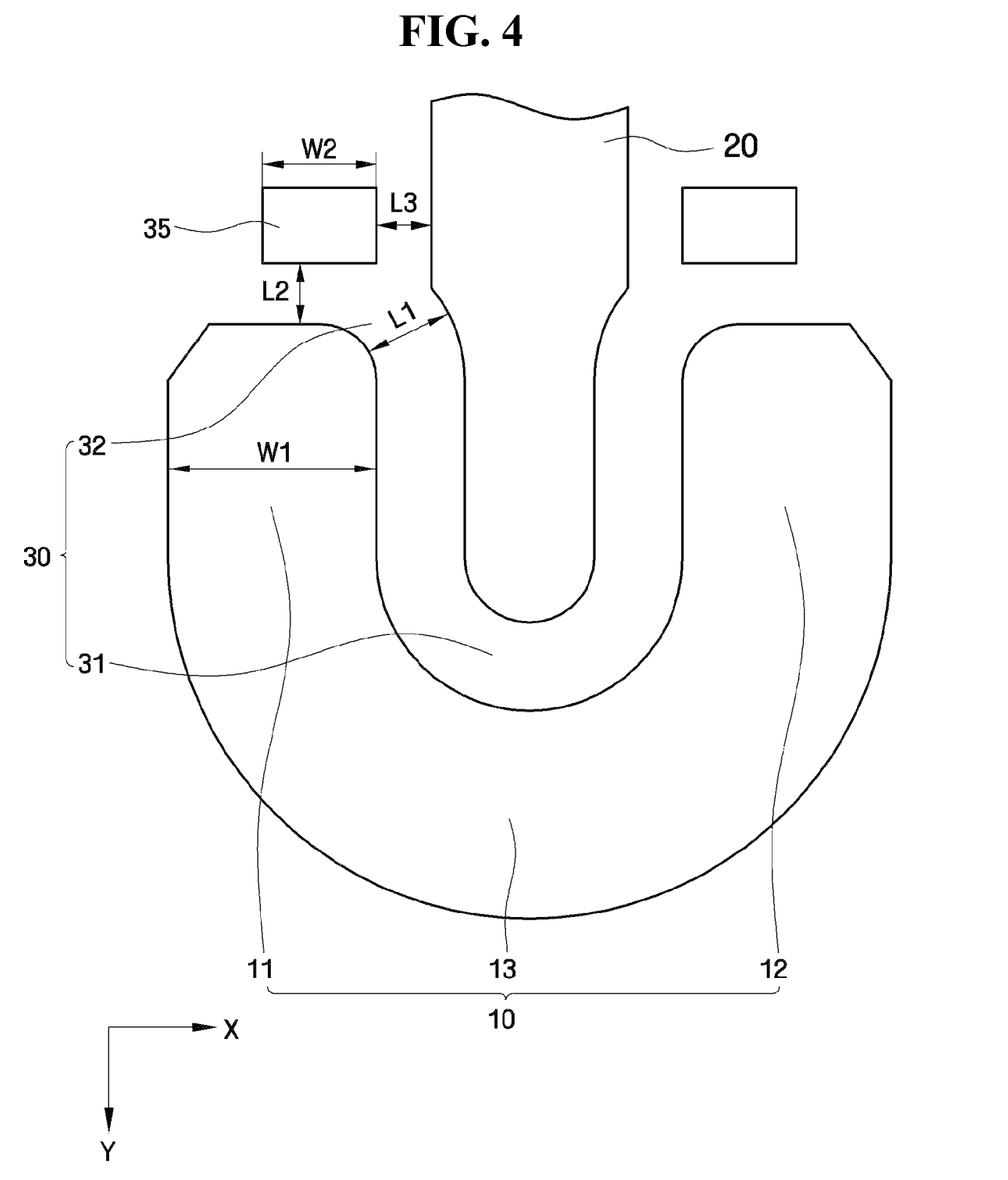
FIG. 4 is a diagram illustrating a structure of a second exemplary embodiment of a photomask according to the present invention.

Hereinafter, a second exemplary embodiment of a photomask according to the present invention will be described with reference to FIG. 4. FIG. 4 is a diagram illustrating a structure of the second exemplary embodiment of a photomask according to the present invention.

Referring to FIG. 4, the second exemplary embodiment of a photomask may include a source electrode pattern 10, a drain electrode pattern 20, a channel region pattern 30 and a bar pattern 35.

Since the source electrode pattern 10, the drain electrode pattern 20 and the channel region pattern 30 are substantially identical to those of the first exemplary embodiment of a photomask, a detailed description thereof will be omitted.

Instead, the bar pattern 35, which is the main difference between the first and second exemplary embodiments of the photomasks, will be described in detail.

As shown in FIG. 4, the bar pattern 35 may be disposed corresponding to each of the entrance portions 32 of the channel region pattern 30. In one exemplary embodiment, the bar pattern 35 may be shaped like a rectangle which extends in a second direction (e.g., an X direction). However, exemplary embodiments of the shape of the bar pattern 35 is not limited to the rectangular shape and may vary as desired. For example, alternative exemplary embodiments include configurations wherein the bar pattern 35 may be trapezoidal, circular or have various other shapes.

A side of the bar pattern 35 may be aligned with the first side of a first electrode portion 11, as shown in FIG. 4. A width W2 of the bar pattern 35 (i.e., the distance between a side of the bar pattern 35 to an opposite side thereof) may be smaller than a width W1 of the first electrode portion 11 (i.e., the distance between a side of the first electrode portion 11 and an opposite side thereof). In addition, a distance L3 between a side of the bar pattern 35 and a side of the drain electrode pattern 20 may be smaller than the distance L1 between the source electrode pattern 10 and the drain electrode pattern 20 at each of the entrance portions 32 of the channel region pattern 30. Also, a distance L2 between a side of the bar pattern 35 and the first side of the first electrode portion 11 of the source electrode pattern 10 may be smaller than the distance L1 between the source electrode pattern 10 and the drain electrode pattern 20 at each of the entrance portions 32 of the channel region pattern 30.

After a photoresist pattern is formed using the second exemplary embodiment of a photomask which further includes the bar pattern 35, if a TFT is fabricated using the photoresist pattern, the channel open defect or channel short defect of the TFT can further be reduced. As a result, the reliability of the TFT can further be enhanced.

Hereinafter, a third exemplary embodiment of a photomask according to the present invention will be described with reference to FIGS. 5 through 7.

Figure 5:
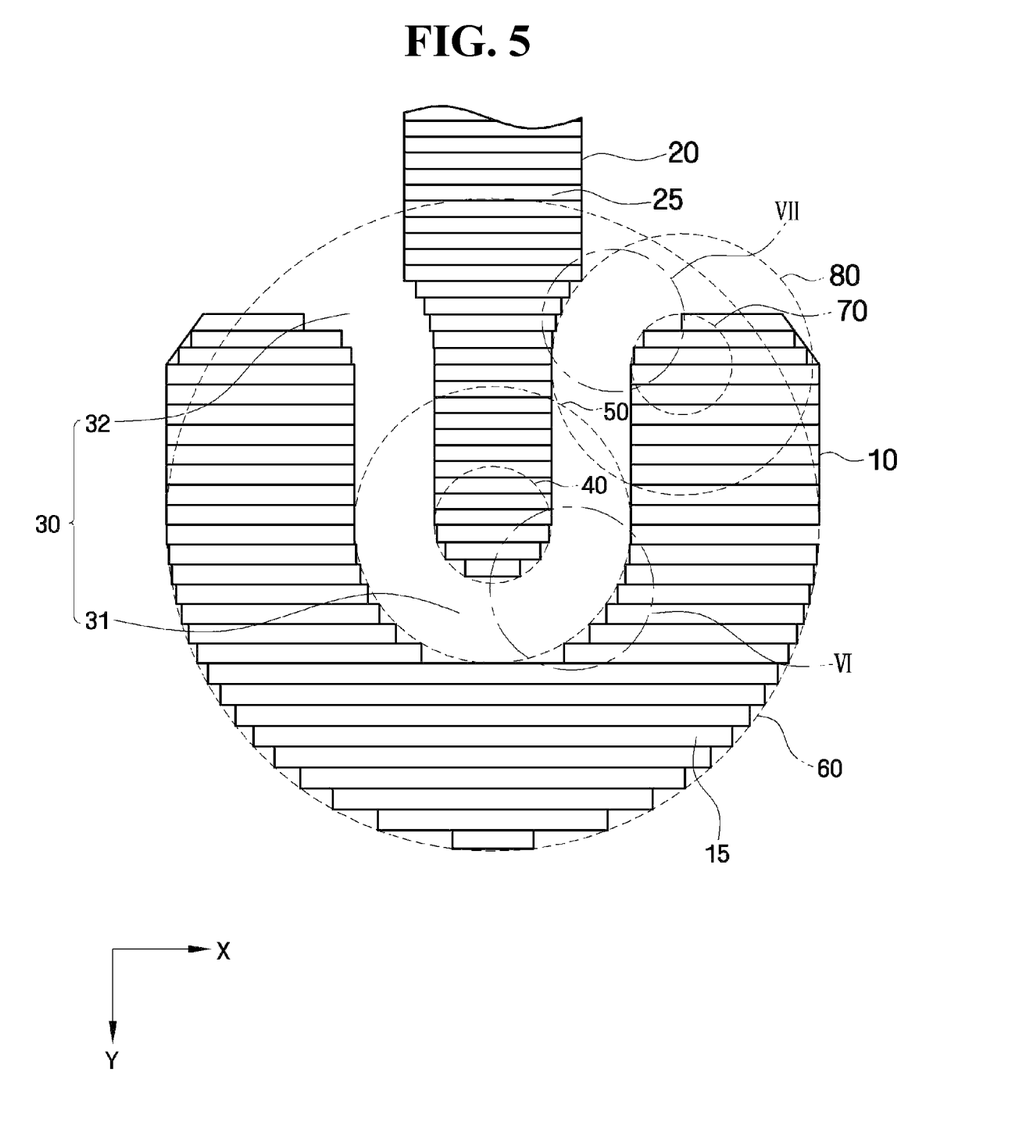
FIG. 5 is a diagram illustrating a structure of a third exemplary embodiment of a photomask according to the present invention.

FIG. 5 is a diagram illustrating a structure of the third exemplary embodiment of a photomask according to the present invention. FIG. 6 is an enlarged diagram of a region VI shown in FIG. 5. FIG. 7 is an enlarged diagram of a region VII shown in FIG. 5.

Referring to FIG. 5, the third exemplary embodiment of a photomask may include a source electrode pattern 10, a drain electrode pattern 20 and a channel region pattern 30.

The source electrode pattern 10 may include a plurality of source electrode segments 15. In the present exemplary embodiment, each of the source electrode segments 15 may be a rectangle which extends in the second direction (e.g., an X direction). However, the present invention is not limited thereto. In fact, another exemplary embodiment includes a configuration wherein each of the source electrode segments 15 may be a rectangle which extends in the first direction (e.g., the Y direction) (not shown).

The drain electrode pattern 20 may include a plurality of drain electrode segments 25. Each of the drain electrode segments 25 may be a rectangle which extends in the second direction (e.g., the X direction). However, the present invention is not limited thereto. In fact, another exemplary embodiment includes a configuration wherein each of the drain electrode segments 25 may be a rectangle which extends in the first direction (e.g., the Y direction) (not shown).

The length of the source electrode segments 15 in the first direction (e.g., the Y direction), also hereinafter referred to as a "height" of the source electrode segments 15, may be substantially equal to that of the drain electrode segments 25 as shown in FIG. 5. However, alternative exemplary embodiments include configurations wherein the source electrode segments 15 and the drain electrode segments 25 may have different heights.

Three or more of the source electrode segments 15 may have edges which contact a first virtual circle 50. In addition, three or more of the drain electrode segments 25 may have edges which contact a second virtual circle 40.

Figure 6:
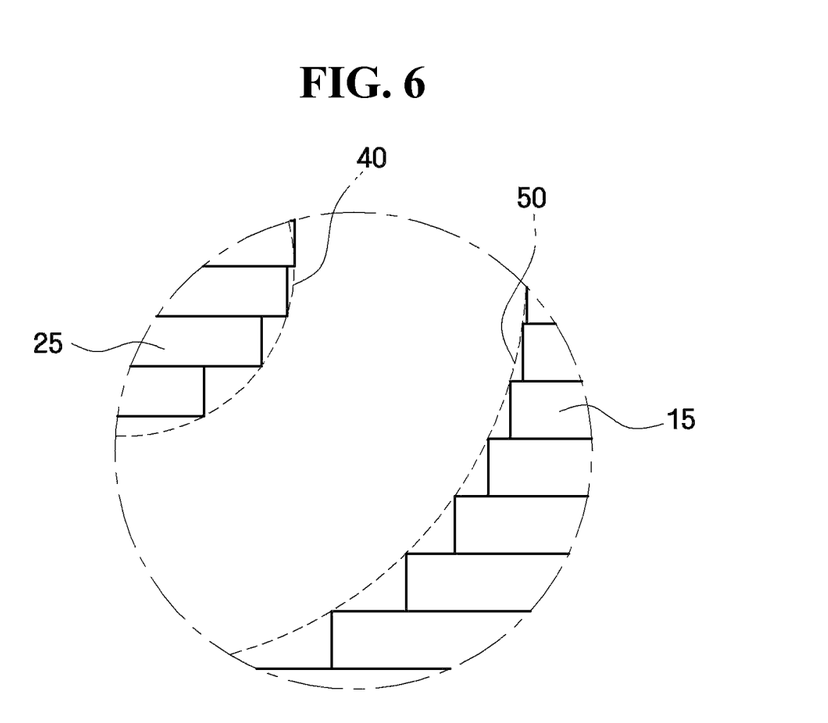
FIG. 6 is an enlarged diagram of a region VI shown in FIG. 5.

Specifically, referring to FIG. 6, an extension line connecting respective vertices, also referred to as corners, of three or more of the source electrode segments 15 may be part of the first virtual circle 50. In addition, an extension line connecting respective vertices of three or more of the drain electrode segments 15 may be part of the second virtual circle 40.

Referring back to FIG. 5, three or more of the source electrode segments 15 may contact a third virtual circle 60. In addition, some of the source electrode segments 15 may contact both of the first and third virtual circles 50 and 60, depending on their arrangement. The first virtual circle 50, the second virtual circle 40, and the third virtual circle 60 may be concentric circles whose centers are located at the same position within the drain electrode pattern 20.

Three or more of the source electrode segments 15 may contact a fourth virtual circle 70, and three or more of the drain electrode segments 25 may contact a fifth virtual circle 80.

Figure 7:
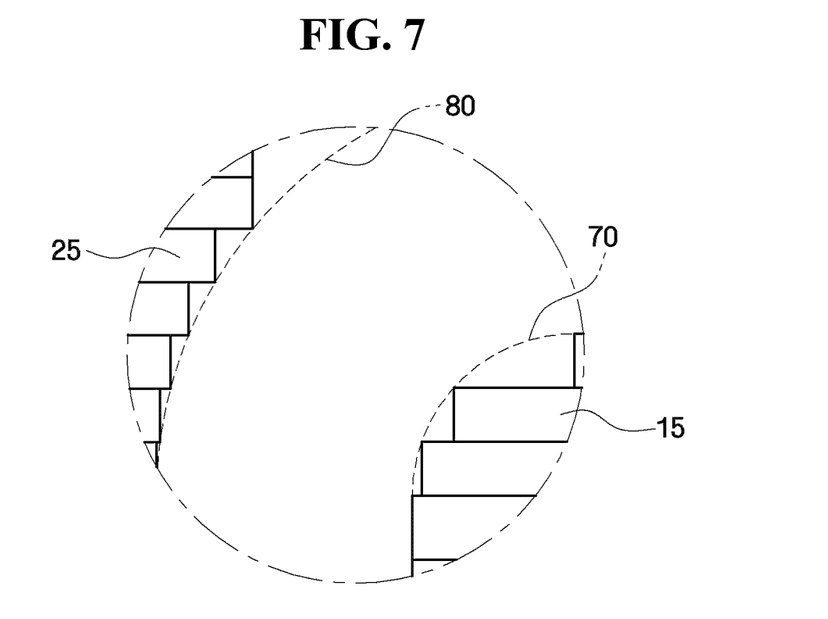
FIG. 7 is an enlarged diagram of a region VII shown in FIG. 5.

Specifically, referring to FIG. 7, an extension line connecting respective vertices of three or more of the source electrode segments 15 may be part of the fourth virtual circle 70. In addition, an extension line connecting respective vertices of the three or more of the drain electrode segments 15 may be part of the fifth virtual circle 80.

The fourth virtual circle 70 and the fifth virtual circle 80 may be concentric circles whose centers are located at the same position within the source electrode pattern 10.

The channel region pattern 30 may be disposed between the source electrode pattern 10 and the drain electrode pattern 20. As in the first exemplary embodiment of a photomask, the channel region pattern 30 included in the third exemplary embodiment of a photomask may include entrance portions 32 and a central portion 31.

Similar to the first exemplary embodiment of a photomask, the present third exemplary embodiment of a photomask ensures fabrication of a more reliable TFT.

Figure 8:
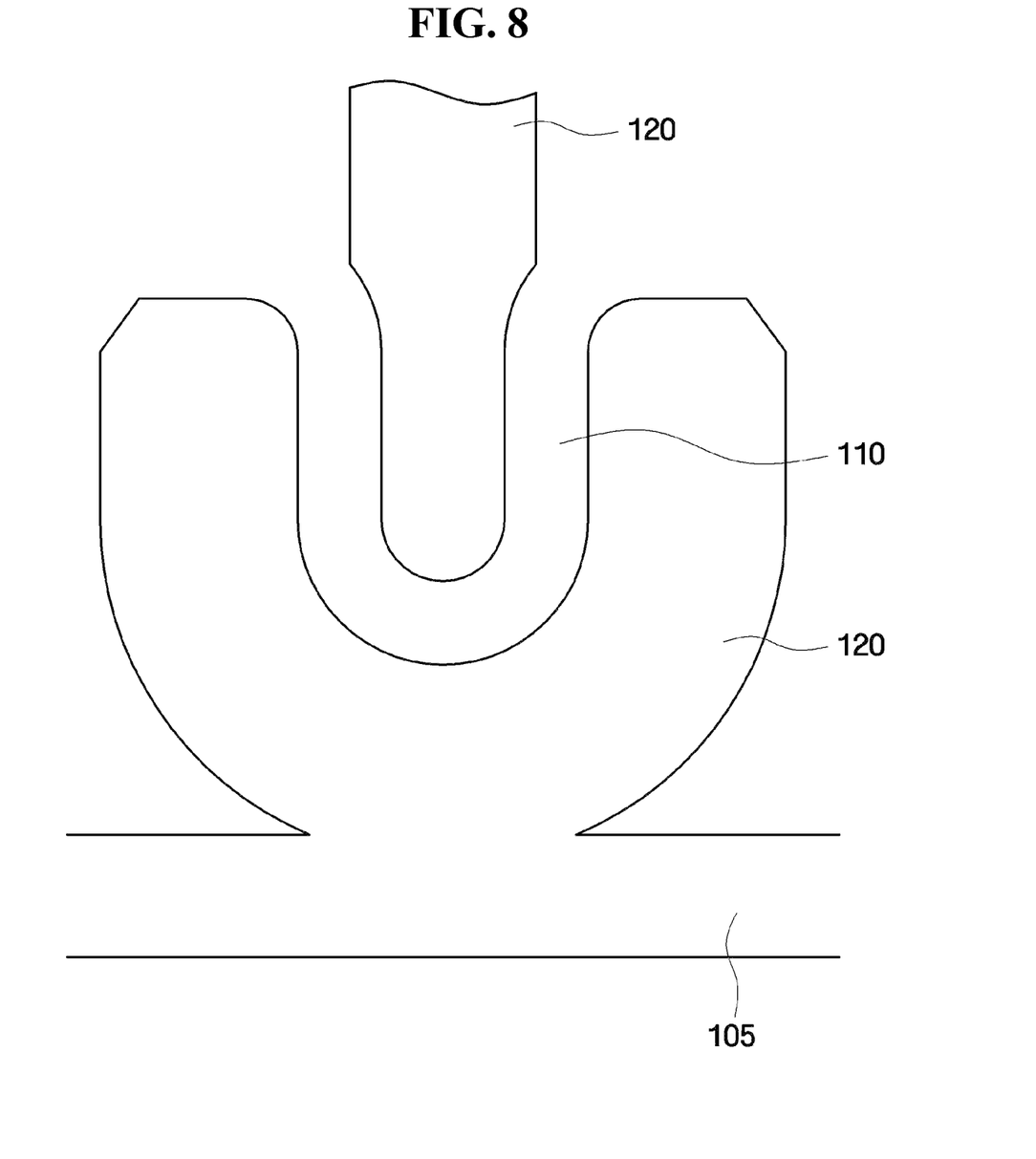
FIG. 8 is a diagram illustrating a structure of a first exemplary embodiment of a thin-film transistor ("TFT") according to the present invention.

Hereinafter, a first exemplary embodiment of a TFT according to the present invention will be described with reference to FIG. 8. FIG. 8 is a diagram illustrating a structure of the first exemplary embodiment of a TFT according to the present invention.

Referring to FIG. 8, the first exemplary embodiment of a TFT may include a source electrode 100, a drain electrode 120 and a channel region 110.

The source electrode 100 may branch off from data wiring 105 and may be fabricated using any one of the above-described photomasks according to the first through third exemplary embodiments of the present invention.

The drain electrode 120 and the channel region 110 may also be fabricated using any one of the photomasks according to the first through third exemplary embodiments of the present invention.

Specifically, a photoresist pattern may be formed using any one of the photomasks according to the first through third exemplary embodiments, and a conductive layer may be etched using the photoresist pattern, thereby forming the source electrode 100, the drain electrode 120, and the channel region 110.

As shown in FIG. 8, the source electrode 100 of the first exemplary embodiment of a TFT may be U-shaped. Also, an end of the drain electrode 120 may be curved to correspond to the U-shaped source electrode 100.

The first exemplary embodiment of a TFT according to the present invention may have reduced number of channel open or channel short defects and thus may also enhanced reliability.

While the present invention has been particularly shown and described with reference to exemplary embodiments thereof, it will be understood by those of ordinary skill in the art that various changes in form and detail may be made therein without departing from the spirit and scope of the present invention as defined by the following claims. The exemplary embodiments should be considered in a descriptive sense only and not for purposes of limitation.

What is claimed is:

1. A photomask comprising:
a source electrode pattern comprising:
a first electrode portion which extends in a first direction;
a second electrode portion which extends in the first direction and is substantially parallel to the first electrode portion; and
a third electrode portion which extends from a first end of the first electrode portion to a first end of the second electrode portion and is rounded with a first curvature;
a drain electrode pattern which extends in the first direction and is disposed between the first electrode portion and the second electrode portion, wherein an end of the drain electrode pattern is rounded to correspond to the third electrode portion; and
a channel region pattern which is disposed between the source electrode pattern and the drain electrode pattern,
wherein a center location of the first curvature and a center location of the rounded portion of the end of the drain electrode pattern are the same,
wherein at least part of a second end of the first electrode portion, disposed substantially opposite to the first end of the first electrode portion, and at least part of a side of the drain electrode pattern, different from the rounded portion of the end of the drain electrode pattern, are rounded to correspond to one another such that a center location of the rounding of the second end of the first electrode portion and a center location of the rounded portion of the side of the drain electrode pattern are the same but different from the center location of the first curvature and the rounded portion of the end of the drain electrode pattern.

2. The photomask of claim 1, wherein the channel region pattern comprises:
an entrance portion; and
a central portion,
wherein a distance between the source electrode pattern and the drain electrode pattern at the entrance portion of the channel region pattern is substantially equal to a distance between the source electrode pattern and the drain electrode pattern at the central portion of the channel region pattern.

3. The photomask of claim 1, wherein the channel region pattern comprises:
an entrance portion;
a central portion; and
the photomask further comprises a bar pattern which is located at the entrance portion of the channel region pattern.

4. The photomask of claim 3, wherein a side of the bar pattern is aligned with a side of the first electrode portion.

5. The photomask of claim 3, wherein a width of the bar pattern is smaller than a width of the first electrode portion.

6. The photomask of claim 3, wherein a distance between a side of the bar pattern and a side of the drain electrode pattern is smaller than a distance between the source electrode pattern and the drain electrode pattern at the entrance portion of the channel region pattern.

7. The photomask of claim 3, wherein a distance between a side of the bar pattern and a side of the source electrode pattern is smaller than a distance between the source electrode pattern and the drain electrode pattern at the entrance portion of the channel region pattern.

8. A thin-film transistor comprising a source electrode, a drain electrode, and a channel region which are fabricated using the photomask of claim 1.

9. The thin-film transistor of claim 8, wherein the source electrode is U-shaped.

* * * * *